United States Patent
Jacobsson et al.

(10) Patent No.: US 9,232,630 B1
(45) Date of Patent: Jan. 5, 2016

(54) METHOD OF MAKING AN INLAY PCB WITH EMBEDDED COIN

(71) Applicant: Flextronics AP, LLC, Broomfield, CO (US)

(72) Inventors: Henrik Jacobsson, Kullavik (SE); Junlin Zhou, Guangdong (CN)

(73) Assignee: Flextronics AP, LLC, Broomfield, CO (US)

( * ) Notice: Subject to any disclaimer, the term of this patent is extended or adjusted under 35 U.S.C. 154(b) by 51 days.

(21) Appl. No.: 13/753,422

(22) Filed: Jan. 29, 2013

Related U.S. Application Data

(60) Provisional application No. 61/649,126, filed on May 18, 2012.

(51) Int. Cl.
*H05K 3/02* (2006.01)
*H05K 3/10* (2006.01)
*H05K 1/02* (2006.01)
*H05K 3/00* (2006.01)

(52) U.S. Cl.
CPC ............... *H05K 1/0204* (2013.01); *H05K 3/00* (2013.01)

(58) Field of Classification Search
CPC ... H01L 21/31691; H01L 23/38; H01L 27/16; H05K 1/0204; H05K 3/00; Y10T 29/49126; Y10T 29/49155
USPC ........... 29/830, 831, 846, 848, 852; 257/737, 257/773; 333/243, 260
See application file for complete search history.

(56) References Cited

U.S. PATENT DOCUMENTS

| | | | |
|---|---|---|---|
| 4,954,453 A | 9/1990 | Venutolo | |
| 5,536,677 A | 7/1996 | Hubacher | |
| 5,607,099 A | 3/1997 | Yeh et al. | |
| 5,872,051 A | 2/1999 | Fallon et al. | |
| 5,873,512 A | 2/1999 | Bielick et al. | |
| 5,974,576 A | 10/1999 | Zhu | |
| 6,083,848 A | 7/2000 | Sugasawara et al. | |
| 6,163,014 A | 12/2000 | Bergeron et al. | |
| 6,189,771 B1 | 2/2001 | Maeda et al. | |
| 6,198,367 B1 * | 3/2001 | Matsunaga et al. | 333/260 |
| 6,201,930 B1 | 3/2001 | Close et al. | |
| 6,202,181 B1 | 3/2001 | Ferguson et al. | |
| 6,245,595 B1 | 6/2001 | Nguyen et al. | |
| 6,299,053 B1 | 10/2001 | Kamath et al. | |
| 6,311,139 B1 | 10/2001 | Kuroda et al. | |
| 6,560,736 B2 | 5/2003 | Ferguson et al. | |
| 6,627,993 B1 * | 9/2003 | Shen | 257/737 |
| 6,677,179 B2 | 1/2004 | Yin et al. | |
| 7,036,059 B1 | 4/2006 | Carmichael et al. | |
| 7,084,356 B2 | 8/2006 | English et al. | |
| 7,225,368 B2 | 5/2007 | Lancaster | |
| 7,324,924 B2 | 1/2008 | Barajos et al. | |
| 7,409,594 B2 | 8/2008 | Mukherjee et al. | |
| 7,513,032 B2 | 4/2009 | Shimamura et al. | |

(Continued)

FOREIGN PATENT DOCUMENTS

| | | | |
|---|---|---|---|
| JP | 06-124953 A | 5/1994 | |
| JP | 07-263450 A | 10/1995 | |

*Primary Examiner* — Donghai D Nguyen
(74) *Attorney, Agent, or Firm* — Haverstock & Owens LLP

(57) ABSTRACT

A printed circuit board comprising: a plurality of dielectric core layers comprising at least a top dielectric core layer and a bottom dielectric core layer; a thermally-conductive coin embedded in at least one of the dielectric core layers; and a high frequency material inlaid in at least one of the dielectric core layers.

13 Claims, 3 Drawing Sheets

(56) References Cited

U.S. PATENT DOCUMENTS

| | | |
|---|---|---|
| 7,529,631 B2 | 5/2009 | Matsushita et al. |
| 7,676,775 B2 | 3/2010 | Chen et al. |
| 7,703,197 B2 | 4/2010 | Moltion |
| 7,836,583 B2 | 11/2010 | Amurao et al. |
| 8,161,428 B2 | 4/2012 | Yokogawa |
| 2001/0003427 A1 | 6/2001 | Ferguson et al. |
| 2001/0018263 A1 | 8/2001 | Ochiai et al. |
| 2002/0053065 A1 | 5/2002 | Mitsutake et al. |
| 2002/0125402 A1 | 9/2002 | Cordes et al. |
| 2003/0170450 A1 | 9/2003 | Stewart et al. |
| 2004/0188497 A1 | 9/2004 | Gruber et al. |
| 2005/0097481 A1 | 5/2005 | Mitsutake et al. |
| 2005/0246590 A1 | 11/2005 | Lancaster |
| 2006/0131360 A1 | 6/2006 | Durston et al. |
| 2006/0225270 A1 | 10/2006 | Wong et al. |
| 2007/0179753 A1 | 8/2007 | Barajas et al. |
| 2007/0198548 A1 | 8/2007 | Lee |
| 2007/0221710 A1 | 9/2007 | Akamatsu et al. |
| 2007/0273011 A1 | 11/2007 | Singleton et al. |
| 2008/0004823 A1 | 1/2008 | Matsushita et al. |
| 2008/0034258 A1 | 2/2008 | Moriya et al. |
| 2008/0140330 A1 | 6/2008 | Morioka et al. |
| 2008/0173699 A1 | 7/2008 | Shoji et al. |
| 2008/0217768 A1 | 9/2008 | Miranda et al. |
| 2008/0224026 A1 | 9/2008 | Pasternak |
| 2008/0301597 A1 | 12/2008 | Chen et al. |
| 2009/0014501 A1 | 1/2009 | Nishi et al. |
| 2009/0120924 A1 | 5/2009 | Moffatt et al. |
| 2009/0265155 A1 | 10/2009 | Yokogawa |
| 2010/0140783 A1 | 6/2010 | Do et al. |
| 2011/0307752 A1 | 12/2011 | Fujil et al. |
| 2012/0192406 A1 | 8/2012 | Hafeli et al. |
| 2012/0286429 A1 | 11/2012 | Han et al. |
| 2012/0326298 A1 | 12/2012 | Lu et al. |
| 2013/0147025 A1 | 6/2013 | Liou et al. |
| 2013/0174110 A1 | 7/2013 | Durkan |
| 2013/0174111 A1 | 7/2013 | Durkan |
| 2014/0057411 A1 | 2/2014 | Hoang et al. |

\* cited by examiner

METHOD OF MAKING AN INLAY PCB WITH EMBEDDED COIN

CROSS-REFERENCE TO RELATED APPLICATIONS

This application claims priority to U.S. Provisional Application Ser. No. 61/649,126, filed May 18, 2012, entitled "INLAY PCB WITH EMBEDDED COIN SAMPLE BOARD EVALUATION STUDY," which is hereby incorporated by reference in its entirety as if set forth herein.

FIELD OF THE INVENTION

The present invention relates to the field of printed circuit boards (PCBs). More particularly, the present invention relates to a PCB with inlaid high frequency material and an embedded coin, and methods of making such structures.

BACKGROUND OF THE INVENTION

PCBs are used to support and electrically connect electronic components. Some PCBs employ embedded metal coins in order to remove the large amounts of heat generated by the electronic components, particularly in high frequency applications. In current embedded coin production, a full panel of dielectric material is in a hybrid configuration with a full panel of high frequency material. This design, however, can include a great deal of expense due to the large amount of high frequency material used.

SUMMARY OF THE INVENTION

The present invention provides a way of reducing the cost of manufacturing PCBs by configuring the high frequency portion of the PCB as an inlay into the dielectric laminate. Since only a small part of the PCB is used for high frequency signal transfer, this inlay design can save the cost of high frequency laminate.

In one aspect of the present invention, a printed circuit board comprises: a plurality of dielectric core layers comprising at least a top dielectric core layer and a bottom dielectric core layer; a thermally-conductive coin embedded in at least one of the dielectric core layers; and a high frequency material inlaid in at least one of the dielectric core layers.

In some embodiments, each one of the dielectric core layers comprises glass and an epoxy. In some embodiments, each one of the dielectric core layers comprises an FR4 type material. In some embodiments, the FR4 type material is selected from the group of materials consisting of EMC EM370, a high-Tg material, and a halogen-free FR4 material.

In some embodiments, the thermally-conductive coin comprises copper. In some embodiments, the thermally-conductive coin extends from the top dielectric core layer to the bottom dielectric core layer.

In some embodiments, the high frequency material does not extend all the way from the top dielectric core layer to the bottom dielectric core layer. In some embodiments, the high frequency material comprises a surface area that is less than half of the area defined by the perimeter of the top dielectric core layer. In some embodiments, the high frequency material comprises a material selected from the group consisting of a glass-reinforced hydrocarbon/ceramic laminate material and a polytetrafluoroethylene (PTFE) material. In some embodiments, the high frequency material comprises a Rogers RO4000® series material.

In some embodiments, multiple layers of electrically-conductive material, multiple layers of prepreg material, and additional dielectric core layers are disposed between the top dielectric core layer and the bottom dielectric core layer.

In another aspect of the present invention, a method of making a printed circuit board comprises: forming a plurality of dielectric core layers comprising at least a top dielectric core layer and a bottom dielectric core layer; embedding a thermally-conductive coin in at least one of the dielectric core layers; and forming a high frequency material inlay in at least one of the dielectric core layers.

In some embodiments, forming the high frequency material inlay in at least one of the dielectric core layers comprises: routing the high frequency material inlay; measuring the actual size of the high frequency material inlay subsequent to its routing; and routing an inlay opening in the at least one of the dielectric layers in which the high frequency material inlay is to be inlaid, wherein the routing of the inlay opening is based on the measured actual size of the high frequency material inlay. In some embodiments, the inlay opening is routed such that the difference between the diameter of the inlay opening and the diameter of the high frequency material inlay is between approximately 2-3 mil. In some embodiments, forming the high frequency material inlay in at least one of the dielectric core layers comprises forming an inlay opening in the at least one of the dielectric layers in which the high frequency material inlay is to be inlaid, wherein the inlay opening is approximately 1-2 mil per side larger than the high frequency material inlay.

In some embodiments, each one of the dielectric core layers comprises glass and an epoxy. In some embodiments, each one of the dielectric core layers comprises an FR4 type material. In some embodiments, the FR4 type material is selected from the group of materials consisting of EMC EM370, a high-Tg material, and a halogen-free FR4 material.

In some embodiments, the thermally-conductive coin comprises copper. In some embodiments, the thermally-conductive coin extends from the top dielectric core layer to the bottom dielectric core layer.

In some embodiments, the high frequency material inlay does not extend all the way from the top dielectric core layer to the bottom dielectric core layer. In some embodiments, the high frequency material inlay comprises a surface area that is less than half of the area defined by the perimeter of the top dielectric core layer. In some embodiments, the high frequency material inlay comprises a material selected from the group consisting of a glass-reinforced hydrocarbon/ceramic laminate material and a polytetrafluoroethylene (PTFE) material. In some embodiments, the high frequency material inlay comprises a Rogers RO4000® series material.

In some embodiments, multiple layers of electrically-conductive material, multiple layers of prepreg material, and additional dielectric core layers are disposed between the top dielectric core layer and the bottom dielectric core layer.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein can be applied to other embodiments. Thus, the present invention is not intended to be limited to the embodiment shown, but is to be accorded the widest scope consistent with the principles and features described herein.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Additionally, it is contemplated that process steps can be performed in a different order than the order illustrated in the flowcharts unless otherwise disclosed, either explicitly or implicitly.

Furthermore, it is contemplated that any features from any embodiment can be combined with any features from any other embodiment. In this fashion, hybrid configurations of the disclosed embodiments are well within the scope of the present invention.

Figure 1:
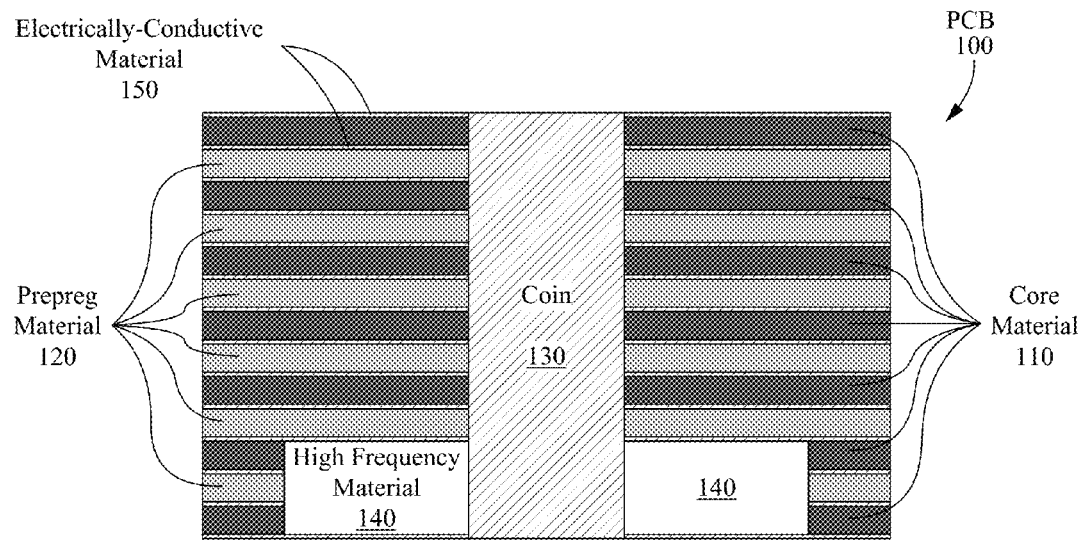
FIG. 1 illustrates a cross-sectional side view of a printed circuit board in accordance with some embodiments of the present invention.

FIG. 1 illustrates a cross-sectional side view of a PCB 100 in accordance with some embodiments of the present invention. PCB 100 comprises a plurality of dielectric core layers 110. A thermally-conductive coin 130 is embedded in at least one of the dielectric core layers 110. A high frequency material 140 is inlaid in at least one of the dielectric core layers 110.

It is contemplated that the plurality of dielectric core layers 110 can comprise various numbers of dielectric core layers. It is also contemplated that the dielectric core layers 110 can comprise a variety of materials. In some embodiments, each one of the dielectric core layers 110 comprises glass and an epoxy. In some embodiments, each one of the dielectric core layers 110 comprises an FR4 type material. In some embodiments, the FR4 type material is selected from the group of materials consisting of EMC EM370, a high-Tg material, and a halogen-free FR4 material. In some embodiments, a thin layer of electrically-conductive material 150 is laminated to both sides of each of the dielectric core layers 110. In some embodiments, the electrically-conductive material 150 is a copper foil. In some embodiments, each one of the dielectric core layers 110 comprises approximately a half-ounce of copper on both sides. In some embodiments, each one of the dielectric core layers 110 comprises a thickness of approximately 6 mil H/H.

In some embodiments, a layer of prepreg material 120 is disposed between each neighboring pair of dielectric core layers 110. In some embodiments, the prepreg material 120 comprises prepreg 1501 with a resign content of 49% by weight. In some embodiments, the PCB 100 comprises multiple alternating layers of dielectric core material, prepreg material, and electrically-conductive material. In some embodiment, these multiple alternating layers are heat-pressed and adhered together.

In some embodiments, the thermally-conductive coin 130 comprises copper. As shown in FIG. 1, in some embodiments, the thermally-conductive coin 130 extends from the top dielectric core layer to the bottom dielectric core layer. However, it is contemplated that, in some embodiments, the thermally-conductive coin 130 does not extend all the way from the top dielectric core layer to the bottom dielectric core layer. In some embodiments, the coin 130 comprises dimensions of approximately 47.6 mm×8.2 mm×2.4 mm. However, it is contemplated that other coin sizes are within the scope of the present invention.

As shown in FIG. 1, in some embodiments, the high frequency material 140 does not extend all the way from the top dielectric core layer to the bottom dielectric core layer. In some embodiments, the high frequency material 140 comprises a polytetrafluoroethylene (PTFE) material. In some embodiments, the high frequency material 140 comprises a glass-reinforced hydrocarbon/ceramic laminate material. In some embodiments, the high frequency material 140 comprises a Rogers RO4000® series material. In some embodiments, the high frequency material 140 comprises RO4350B™. In some embodiments, the high frequency portion 140 of the PCB 100 comprises dimensions of approximately 12.5 cm×11.4 cm, and is approximately 20 mil H/H thick. However, it is contemplated that other dimensions are within the scope of the present invention.

In some embodiments, multiple layers of electrically-conductive material, multiple layers of pre-preg material, and additional dielectric core layers are disposed between the top dielectric core layer and the bottom dielectric core layer. In some embodiments, at least one layer of pre-preg material is disposed between the top dielectric core layer and the bottom dielectric core layer. In some embodiments, the PCB comprises 14 layers of electrically-conductive material. However, it is contemplated that other numbers of layers are within the scope of the present invention. In some embodiments, the PCB 100 is approximately 31.5 cm×28.3 cm, with a thickness of approximately 2.4 mm. However, it is contemplated that other board dimensions are within the scope of the present invention.

Figure 2:
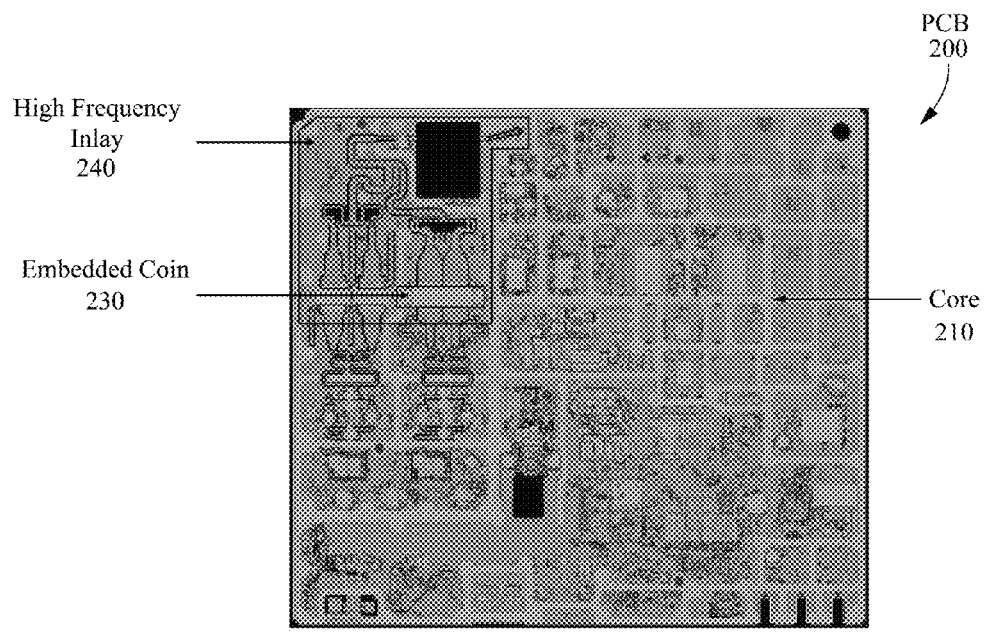
FIG. 2 illustrates a plan view of a printed circuit board in accordance with some embodiments of the present invention.

FIG. 2 illustrates a plan view of a PCB 200, similar to PCB 100 in FIG. 1, in accordance with some embodiments of the present invention. PCB 200 comprises dielectric core material 210, similar to the dielectric core material 110 in FIG. 1. A thermally-conductive coin 230, similar to coin 130 in FIG. 1, is embedded within the dielectric core material 210. A high frequency material 240, similar to high frequency material 140 in FIG. 1, is inlaid into the dielectric material 210. Since only a small part of PCBs are used for high frequency signal transfer, the present invention employs an inlay design for the high frequency material 140, thereby reducing the amount of high frequency material used, and consequently reducing the cost of the PCB. As seen in FIG. 2, the high frequency inlay 240 accounts for only a small portion of the PCB. In some embodiments, the high frequency inlay 240 comprises a surface area that is less than half of the area defined by the perimeter of the top dielectric core layer. In some embodiments, the high frequency inlay 240 comprises a surface area that is less than a quarter of the area defined by the perimeter of the top dielectric core layer.

In some embodiments, the present invention employs openings in the dielectric core layers and the prepreg layers for both the high frequency inlay and the embedded coin. In some embodiments, the high frequency inlay is outlined by routing and is preferably the same as in the Gerber design. In some embodiments, in a 14 layer PCB, an opening for the high frequency inlay is formed in the dielectric core layers that correspond to electrically-conductive layers 11 through 14. In some embodiments, the size of the high frequency inlay opening is approximately 1-2 mil per side larger than the high frequency inlay. In some embodiments, an opening for the embedded coin is formed in the dielectric core layers that correspond to electrically-conductive layers 1 through 10. In some embodiments, this opening is formed by routing. In some embodiments, the size of the opening for the coin is the coin size plus approximately 4.5 mil per side. In some embodiments, an opening for the high frequency inlay is formed in the prepreg layers. In some embodiments, the size of this high frequency opening is approximately the size of the high frequency inlay plus 6 mil per side. In some embodiments, an opening for the embedded coin is formed in the prepreg layers. In some embodiments, the size of this coin opening is approximately the size of the coin plus 6 mil per side. It is contemplated that other numbers of layers through which the previously discussed openings extend are within the scope of the present invention.

In inlay PCB design, size matching between the high frequency inlay and its opening in the dielectric core layers is critical. If the high frequency inlay is too large, then it will be difficult to fit into the opening in the dielectric core layers. If the high frequency inlay is too small, then there will not be enough resin to fill in the gap between the high frequency inlay and the dielectric core material. Therefore, in some embodiments, the high frequency inlay is routed out first and then measured for its actual size. The opening in the dielectric core material is then routed out according to the high frequency inlay size by changing routing compensation in order to keep the size difference within 2-3 mil.

During experimentation, the PCB layers were fixed together by bonding and a rivet. Both the coin and the high frequency inlay were then inserted into the opening in the lay-up table. As there was no guiding hole for the high frequency inlay, it was free to move during lamination. Since the high frequency inlay was free to move during lamination, alignment of the high frequency inlay with the underlying dielectric core layers was intrinsically poorer. In addition to the size difference between the high frequency inlay and its opening in the dielectric core material, routing position tolerance also contributed to the misalignment of the high frequency inlay with the underlying dielectric core layers. In this experimentation, it was found that there was about a 5 mil shift between the high frequency inlay and the underlying dielectric core layers even with the size difference between the high frequency inlay and its opening in the dielectric core material being within 3 mil. Combining the dielectric core material multilayer dimensional change in lamination and drill position tolerance, there was approximately a 10 mil shift between the drill hole and the high frequency inlay.

Comparing the inlay PCB configuration of the present invention with the non-inlay configuration, because of the symmetrical dielectric core layer stackup and relatively small size high frequency inlay, the finished board of the present invention showed less warpage than the non-inlay design. There was no delamination after solder shock (260° C., 20 sec, 6×). There was no delamination after reflow (260° C., 5×).

An important part of the inlay PCB design is size matching between the high frequency inlay and its opening in the dielectric core layers. This size difference and routing position tolerance affect layer alignment accuracy. In some embodiments, the capture pad adjacent to the high frequency inlay is approximately the drill size plus 20 mil in order to avoid hole breakout.

Figure 3:
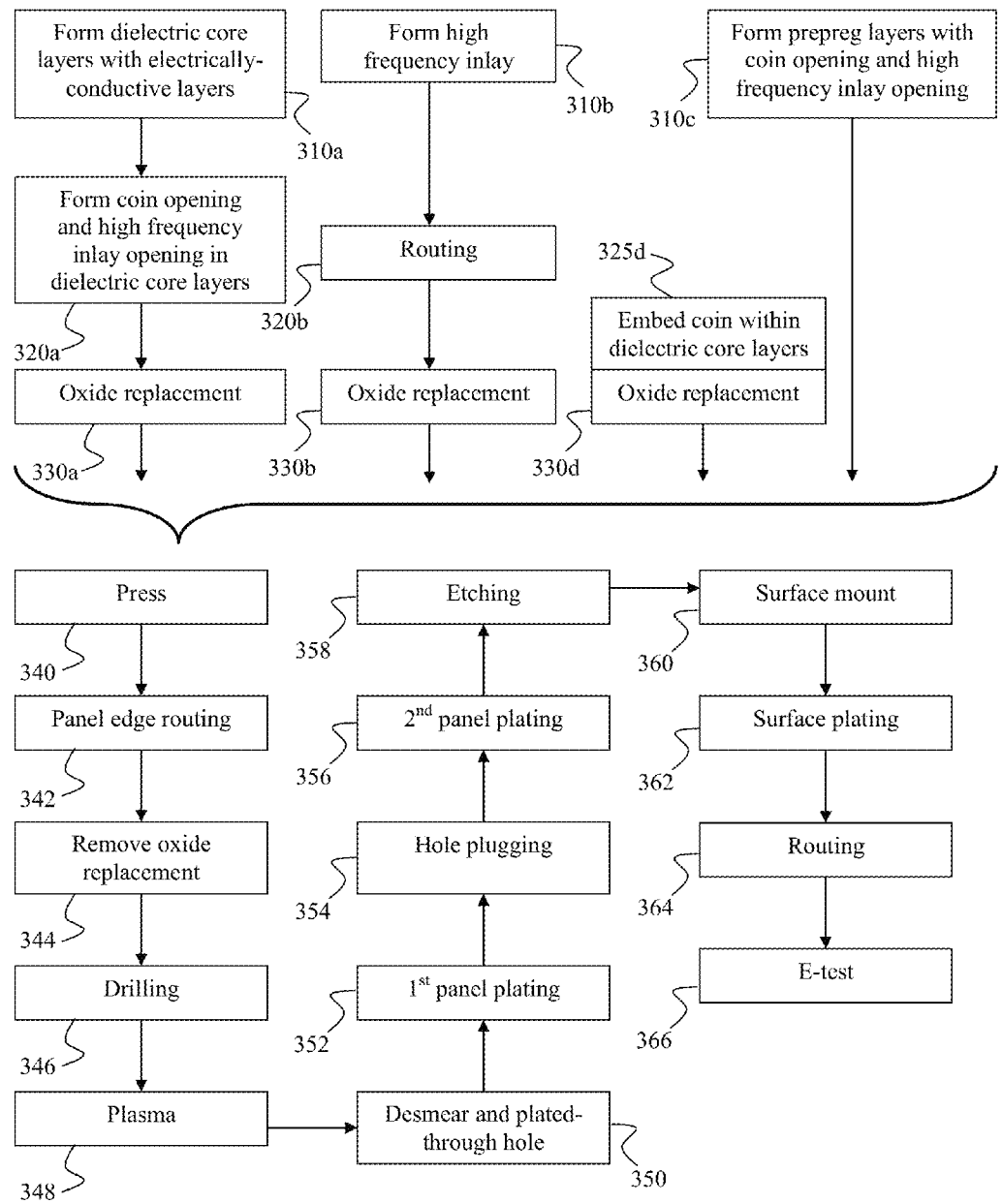
FIG. 3 illustrates a method of making a printed circuit board in accordance with some embodiments of the present invention.

FIG. 3 illustrates a method of making a PCB in accordance with some embodiments of the present invention. At step 310a, the layers of dielectric core material and electrically-conductive material are formed. In some embodiments, these layers are formed using a develop-etch-strip (DES) line. In some embodiments, the layer count of the PCB is 14. At step 310b, the high frequency inlay is formed. In some embodiments, the high frequency inlay is formed using a DES line. At step 310c, a window opening for the thermally-conductive coin is formed in the prepreg layers, as well as an opening for the high frequency inlay. In some embodiments, these openings are formed by routing. At step 320a, an opening for the coin and an opening for the high frequency inlay are formed in the dielectric core layers. In some embodiments, these openings are formed by routing. At step 320b, routing is performed for the high frequency inlay. At step 325d, the coin is embedded within the dielectric core layers. At steps 330a, 330b, and 330d, an oxide replacement process is performed.

At step 340, the layers of the PCB are pressed. In some embodiments, the layers of the PCB are heat pressed. At step 342, panel edge routing is performed. At step 344, the oxide replacement is removed. At step 346, drilling is performed on the PCB. In some embodiments, this drilling is used to form through-holes in the PCB. At step 348, a plasma treatment is performed on the PCB. In some embodiments, this plasma treatment is used to clean the PCB. At step 350, a desmearing process is performed and the through-hole is plated. At step 352, a first panel of the PCB is plated. In some embodiments, the first panel is plated using a plating bath. At step 354, certain holes in the PCB are plugged. In some embodiments, the holes that do not need to be plated are plugged. At step 356, a second panel of the PCB is plated. In some embodiments, the second panel is plated using a plating bath. At step 358, an etching process is performed. At step 360, PCB components are mounted directly onto the surface of the PCB. At step 362, a surface plating process is performed on the PCB. In some embodiments, this surface plating process involves electroless nickel immersion gold (ENIG). At step 364, routing is performed on the PCB. Finally, at step 360, an electronic test is performed after the PCB has been manufactured. In some embodiments, the layout of the PCB is analyzed according to the net list from the Gerber data for incorrect or missing connections in order to detect potential short circuits and interruptions.

Figure 4A:
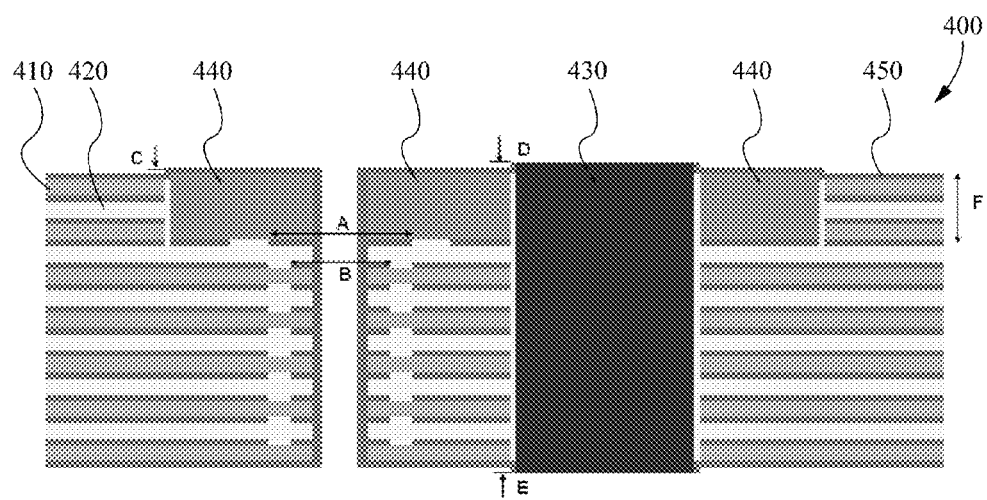
FIG. 4A illustrates cross-sectional side view of another printed circuit board in accordance with some embodiments of the present invention.
Figure 4B:
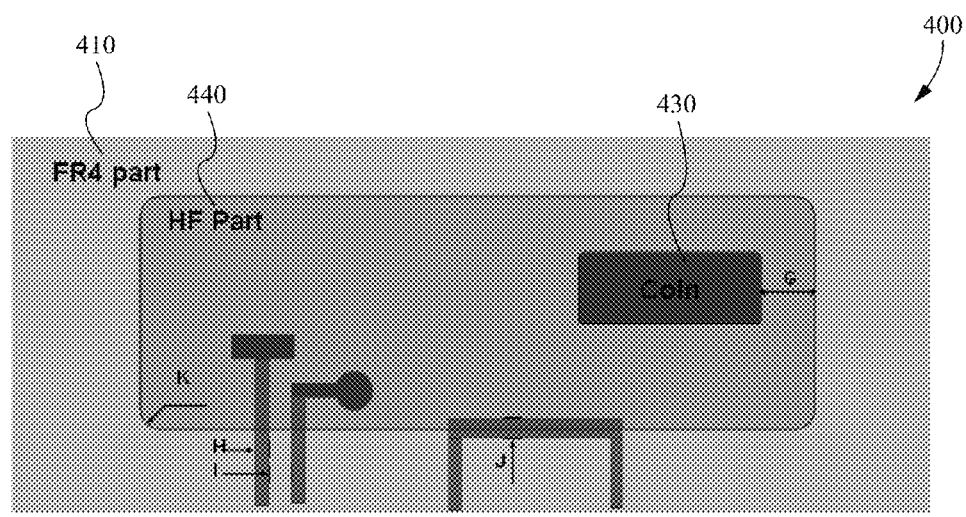
FIG. 4B illustrates a plan view of the printed circuit board of FIG. 4A in accordance with some embodiments of the present invention.

FIGS. 4A-B illustrate another PCB 400 in accordance with some embodiments of the present invention. PCB 400 comprises a plurality of dielectric core layers 410, similar to dielectric core layers 110 in FIG. 1. A thermally-conductive coin 430, similar to coin 130 in FIG. 1, is embedded in at least one of the dielectric core layers 410. A high frequency material 440, similar to high frequency material 140 in FIG. 1, is inlaid in at least one of the dielectric core layers 410. A thin layer of electrically-conductive material 450, similar to electrically-conductive material 150 in FIG. 1, is laminated to both sides of each of the dielectric core layers 410. A layer of prepreg material 420, similar to prepreg material 120 in FIG. 1, is disposed between each neighboring pair of dielectric core layers 410.

It is contemplated that different size configurations are within the scope of the present invention. However, certain configurations have been found to be beneficial. In some embodiments, the high frequency inlay 440 comprises dimensions of between approximately 10 cm×10 cm and approximately 20 cm×25 cm. In some embodiments, the inlay capture size (labeled 'A' in FIG. 4A) is approximately the drill size plus 20 mil. In some embodiments, the inner layer capture size (labeled 'B' in FIG. 4A) is approximately the drill size plus 10 mil. In some embodiments, the inlay protrusion (labeled 'C' in FIG. 4A) is approximately +/−1 mil. In some embodiments, the coin depression (labeled 'D' in FIG. 4A) is approximately +/−0.02 μm. In some embodiments, the coin protrusion (labeled 'E' in FIG. 4A) is approximately 0-0.04 μm. In some embodiments, the high frequency inlay layer count (labeled 'F' in FIG. 4A) is 2-4. In some embodiments, the minimum coin to inlay distance (labeled 'G' in FIG. 4B) is approximately 5 mm. In some embodiments, the coin size is approximately 8-50 mm. In some embodiments, the minimum line width (labeled 'H' in FIG. 4B) is approximately 6 mil. In some embodiments, the minimum space across the cavity (labeled 'I' in FIG. 4B) is approximately 6 mil. In some embodiments, the minimum line width along the cavity (labeled 'J' in FIG. 4B) is approximately 40 mil. In some embodiments, the minimum corner radius (labeled 'K' in FIG. 4B) is approximately 0.6 mm.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications can be made in the embodiment chosen for illustration without departing from the spirit and scope of the invention as defined by the claims.

What is claimed is:

1. A method of making a printed circuit board, the method comprising:
   forming a plurality of dielectric core layers comprising at least a top dielectric core layer and a bottom dielectric core layer;
   embedding a thermally-conductive coin in at least one of the dielectric core layers; and
   forming a high frequency material inlay in at least one of the dielectric core layers comprising:
   a) routing the high frequency material inlay;
   b) measuring the actual size of the high frequency material inlay subsequent to its routing; and
   c) routing an inlay opening in the at least one of the dielectric layers in which the high frequency material inlay is to be inlaid, wherein the routing of the inlay opening is based on the measured actual size of the high frequency material inlay.

2. The method of claim 1, wherein the inlay opening is routed such that the difference between the diameter of the inlay opening and the diameter of the high frequency material inlay is between approximately 2-3 mil.

3. The method of claim 1, wherein forming the high frequency material inlay in at least one of the dielectric core layers comprises forming an inlay opening in the at least one of the dielectric layers in which the high frequency material inlay is to be inlaid, wherein the inlay opening is approximately 1-2 mil per side larger than the high frequency material inlay.

4. The method of claim 1, wherein each one of the dielectric core layers comprises glass and an epoxy.

5. The method of claim 4, wherein each one of the dielectric core layers comprises an FR4 type material.

6. The method of claim 5, wherein the FR4 type material is selected from the group of materials consisting of EMC EM370, a high-Tg material, and a halogen-free FR4 material.

7. The method of claim 1, wherein the thermally-conductive coin comprises copper.

8. The method of claim 1, wherein the thermally-conductive coin extends from the top dielectric core layer to the bottom dielectric core layer.

9. The method of claim 1, wherein the high frequency material inlay does not extend all the way from the top dielectric core layer to the bottom dielectric core layer.

10. The method of claim 1, wherein the high frequency material inlay comprises a surface area that is less than half of the area defined by the perimeter of the top dielectric core layer.

11. The method of claim 1, wherein the high frequency material inlay comprises a material selected from the group consisting of a glass-reinforced hydrocarbon/ceramic laminate material and a polytetrafluoroethylene (PTFE) material.

12. The method of claim 11, wherein the high frequency material inlay comprises a Rogers RO4000® series material.

13. The method of claim 1, wherein multiple layers of electrically-conductive material, multiple layers of prepreg material, and additional dielectric core layers are disposed between the top dielectric core layer and the bottom dielectric core layer.

* * * * *